United States Patent [19]

Taylor et al.

[11] Patent Number: 5,087,547
[45] Date of Patent: Feb. 11, 1992

[54] DUAL-TONE PHOTORESIST UTILIZING DIAZONAPHTHOQUINONE RESIN AND CARBODIIMIDE STABILIZER

[75] Inventors: James W. Taylor, South Charleston; David R. Bassett, Charleston, both of W. Va.

[73] Assignee: Union Carbide Chemicals & Plastics Technology Corporation, Danbury, Conn.

[21] Appl. No.: 487,657

[22] Filed: Mar. 2, 1990

[51] Int. Cl.$^5$ .................. G03F 7/023; G03C 1/61
[52] U.S. Cl. .................. 430/169; 430/190; 430/191; 430/325
[58] Field of Search .............. 430/191, 196, 192, 325, 430/326, 169, 190

[56] References Cited

U.S. PATENT DOCUMENTS

| | | | |
|---|---|---|---|
| 4,104,070 | 8/1978 | Moritz et al. | 430/329 |
| 4,377,633 | 3/1983 | Abrahanovich et al. | 430/312 |
| 4,546,066 | 10/1985 | Field et al. | 430/314 |
| 4,797,348 | 1/1989 | Nakamura et al. | 430/325 |

OTHER PUBLICATIONS

Noller, Textbook of Organic Chemistry, 2nd Edition, 1958, pp. 246-247.

*Primary Examiner*—Charles L. Bowers, Jr.
*Assistant Examiner*—Christopher G. Young
*Attorney, Agent, or Firm*—Paul W. Leuzzi, II

[57] ABSTRACT

The resolution and stability of liquid, dual-tone photoresist formulations containing novolac resins and photoactive compounds are enhanced by the incorporation therein of certain carbodiimide resolution enhancers.

20 Claims, 1 Drawing Sheet

PROCESS ROUTES TO PRODUCE IMAGE REVERSAL.

DUAL-TONE PHOTORESIST UTILIZING DIAZONAPHTHOQUINONE RESIN AND CARBODIIMIDE STABILIZER

BACKGROUND OF THE INVENTION

1) Field of the Invention

This invention relates in general to dual-tone photoresists. In one aspect, this invention is directed to photoresist formulations which produce a positive or negative image depending upon processing conditions. In another aspect, this invention relates to liquid, positive photoresist formulations having improved high temperature stability. The invention also provides formulations containing certain di-substituted carbodiimides as resolution enhancement reagents.

2) Description of the Related Art

Photoresists are photosensitive materials which change their solubility after exposure to light. They are typically novolac resins which have a diazonaphthoquinone (DANQ) sensitizer attached to the polymer backbone or added to the resist formulation. Diazonaphthoquinone sensitizers also act as inhibitors which decrease the solubility of diazonaphthoquinone-novolac films in basic solutions.

A dual-tone photoresist is defined as a photoresist capable of producing positive or negative images depending upon processing conditions. In 1978, H. Moritz and G. Paul described in U.S. Pat. No. 4,104,070, that the addition of monazoline (1-hydroxyethyl-2-alkyl imidazoline) to a positive working photoresist formulation allowed image reversal (negative images) to be obtained. S. A. MacDonald et al, Interface, p. 114 (1982), reported further modification of this process by using a similar additive, imidazole. Other basic chemicals such as triethanolamine and gaseous amines have also been reported as having the ability to cause image reversal.

If liquid bases are added to photoresist formulations, they have poor formulation stability. As a result, potential commercial dual-tone photoresists users treat photoresist films with gaseous amines, after exposure, to cause reversal. The use of gaseous amines, however, requires baking the resist in the presence of a poisonous gas. To date, dual-tone photoresists are still being commercialized by some fabricators who use this technique.

Recent studies have shown that image reversal could be accomplished by adding polycarbodiimides to a diazonaphthoquinone-novolac photoresist formulation. Images with good heat stability were demonstrated. However, the formulations were not stable.

Accordingly, one or more of the following objects will be achieved by the practice of this invention. It is an object of this invention to provide a novel photoresist formulation. A further object of this invention is to provide a photoresist formulation of the novolac-type which has improved stability. A still further object is to provide a formulation which avoids the use of dangerous gases in its preparation. A further object of this invention is to provide a photoresist formulation containing a di-substituted carbodiimide. Another object of this invention is to provide a method for the preparation of the formulations and their use in the preparation of positive or negative images. Another object of this invention is to provide dual-tone photoresist formulations from which positive and negative images can be prepared with linewidths of from about 3 microns or less, to about 5 mils or higher. A further object is to provide photoresist formulations which can be used for imaging films of thicknesses of from about 1.5 to about 5.5 microns. A still further object is to provide photoresist formulations for use in preparing images wherein exposure energies range from about 89 millijoules per square centimeter for semiconductor applications to about 140 millijoules per square centimeter for circuit board applications. These and other objects will readily become apparent to those skilled in the art in the light of the teachings herein set forth.

SUMMARY OF THE INVENTION

This invention is directed to liquid, dual-tone photoresist formulations, and to a process for improving the stability as well as enhancing the resolution of images prepared using such formulations.

The dual-tone liquid photoresist formulations of the present invention which are useful for the production of positive or negative images are comprised of:
(a) a phenolformaldehyde resin,
(b) a photoactive compound, and
(c) a carbodiimide of the formula:

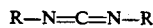

wherein each R can independently represent a secondary or tertiary alkyl group of from 3 to 30 carbon atoms, a cycloalkyl group of up to 30 carbon atoms, or one R can represent an aryl group of up to 30 carbon atoms. Preferably, the R groups contain up to 15 carbon atoms.

DESCRIPTION OF THE PREFERRED EMBODIMENTS

Figure 1:
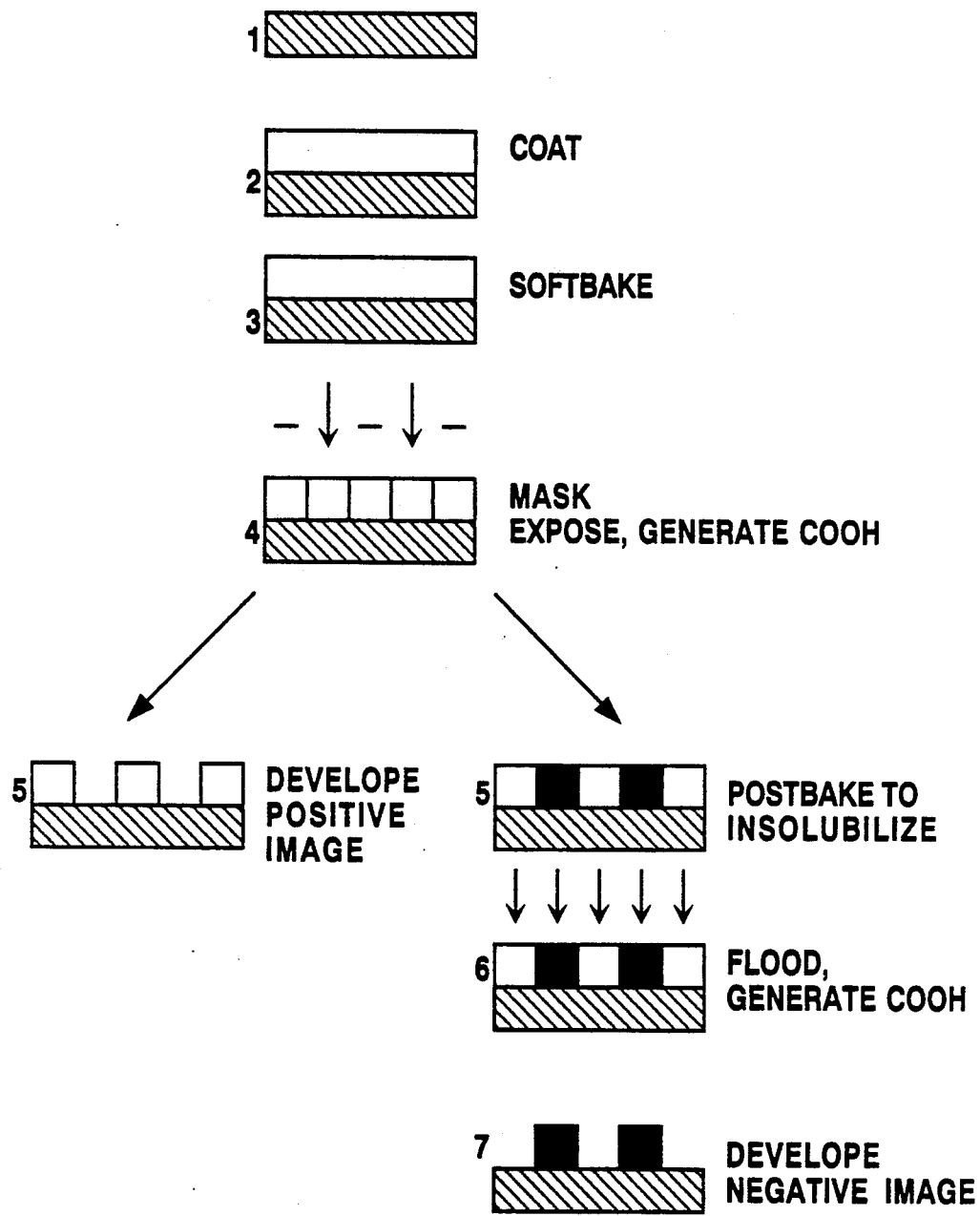
FIG. 1 is a flow diagram of the process routes to produce image reversal.

As noted above, the addition of certain carbodiimides to diazoquinone-novolac photoresists gives a dual-tone photoresist formulation which has improved stability and enhanced resolution. Positive and negative images with linewidths of from about 3 microns to about 5 mils have been prepared using the formulations of this invention.

A study was made of photoresists consisting of a novolac resin which has 3.3 mole percent of the diazonaphthoquinone sensitizer (DANQ) attached to the polymer backbone. DANQ sensitizers act as inhibitors to decrease the solubility of the photoresist in basic solutions. Exposure of films to light of the proper wavelength causes the formation of a carboxylic acid which renders the novolac resist soluble in an aqueous base.

In the reaction studied, DANQ decomposes to a carbene which then undergoes a Wolff rearrangement to form a ketene. The ketene reacts with water, which is in the film or in the air to form a base-soluble indenecarboxylic acid photo product.

The scheme to produce a positive or negative image is shown in FIG. 1. For a positive image (left side of FIG. 1) the film is developed after exposure. For a negative image the film is baked after exposure to convert carboxylic acid groups produced in step 4 of FIG. 1 to insolubilizing groups. Flood exposure followed by development gives a negative image. Basic materials such as monazoline, imidazole, and triethanolamine are able to catalyze the decarboxylation of indenecarboxylic acid thus forming insolubilizing groups. In the absence of bases, indenecarboxylic acid does not decarboxylate at temperatures below about 160° C.

It has recently been demonstrated that the addition of polycarbodimides to a positive working photoresist formulation results in a dual-tone formulation. Unfortunately, it was discovered that polycarbodiimides react with phenolic hydroxyls too rapidly to form stable resist formulations.

It has now been discovered that certain carbodiimides, such as dicyclohexylcarbodiimide, (DCC), react with the phenolic hydroxyls of a diazonaphthoquinone-novolac photoresist to produce isoureas. This reaction can be shown as follows:

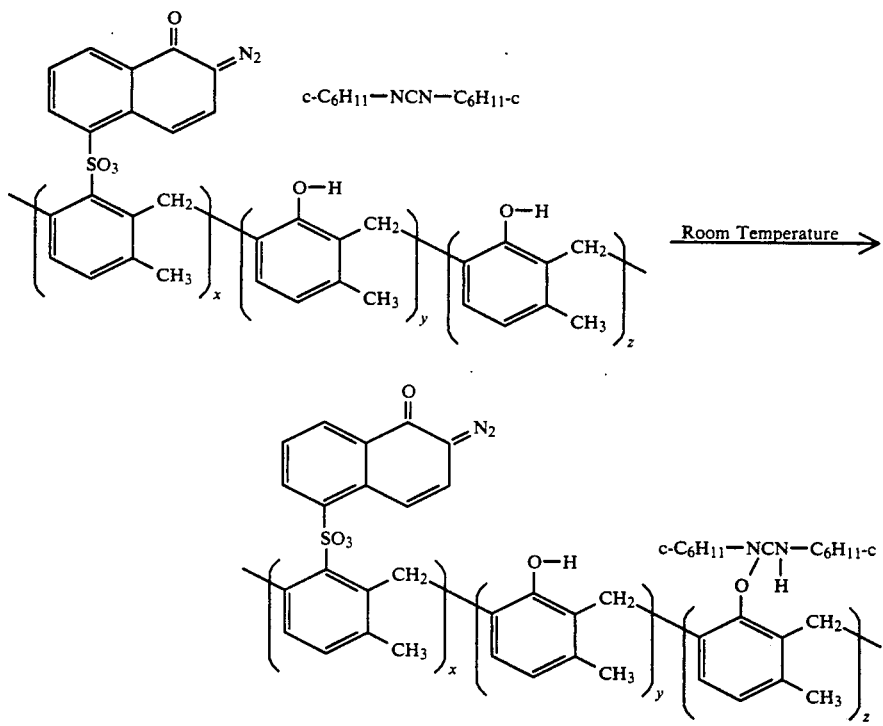

As discussed above, exposure of a dual-tone photoresist film through a mask converts the DANQ to indenecarboxylic acid groups which make the film base soluble. Development with an aqueous base solution gives a positive image (left side, step 5 of FIG. 1). A flood exposure followed by a postbake decreases the solubility of the imaged film. However, exposure of the film followed by postbake, flood exposure, and development gives a negative image. A negative image forms because the indenecarboxylic acid groups, produced (step 4 of FIG. 1) during the exposure, react with the carbodiimides during postbake (right side, step 5 of FIG. 1). This reaction produces N-acyl ureas and/or ester groups, which insolubilizes the exposed area.

Since esterification is a crosslinking reaction and crosslinking improves thermal properties, it is desirable that ester groups form. As shown in FIG. 1, ester groups could form in step 5 in the negative mode.

In order to optimize the positive and negative imaging of dual-tone photoresists, one desires processing conditions in which (a) for a negative imaging system, maximum contrast is achieved when there is no film loss in the exposed area (see step 4 of FIG. 1) and complete film loss in the unexposed area, or (b) for a positive imaging system, maximum contrast is achieved when there is no film loss in the unexposed area (see step 5 of FIG. 1) and complete film loss in the exposed area.

Studies were made of the many variables of the processing conditions including concentration of developers, developer strength, development time, exposure energy, flood energy, level of dissolution inhibitor, softbake and hardbake times, and the like.

The first experiment to demonstrate an image reversal formulation was prepared by reacting 10.5 PHR (grams of DCC per 100 grams of dry photoresist) of DCC at 23° C. with the photoresist in PMA (Propasol M Acetate). The reaction was catalyzed using cuprous chloride. The photoresist contained 3.3 mole percent DANQ attached to the polymer backbone. After three days, FT-IR analysis showed that the reaction was complete. The modified photoresist was spun over a bare silicon wafer then baked in a forced air oven at 70° C. for 30 minutes. Using the process sequence described for a negative (FIG. 1), one side of the coated wafer was masked (unexposed side), then the unmasked portion of the film was exposed to 240 millijoules per square centimeter using a broadband UV light source. The coated wafer was then baked at 90° C. for 30 minutes, and flood exposed, Development in a sodium hydroxide based developer containing 4 percent by weight tetrahydrofuran gave a negative relief image.

After the above experiment, which demonstrated that image reversal was possible with a carbodiimide, an exposure energy of less that 100 millijoules per square centimeter per micron was set as an upper exposure limit. Using the same technique, a series of positive and negative relief images were obtained. Film losses as a function of DCC level were obtained at an exposure energy of 89.5 mJ/cm$^2$.micron. The flood exposure for negative relief images was also 89.5 mJ/cm$^2$.micron. The DANQ level, developer strength, and development time were kept constant. Ideally, the exposed area for negative images should give no film loss, and the exposed area give complete loss. As shown in Table I below, 3 PHR of DCC give the best overall results; however, a lost of 48% instead of 5% in the exposed area and a loss of 83% in the unexposed area instead of 95%, show that further optimization is necessary.

TABLE I

| | | Negative Relief Images | |
|---|---|---|---|
| Trials | PHR DCC | Percent Film Loss Exposed Side | Percent Film Loss Unexposed Side |
| 1 | 3 | 48 | 83 |
| 2 | 4 | 29 | 60 |
| 3 | 5 | 10 | 12 |
| 4 | 6 | 10 | 9 |
| 5 | 7 | 3 | 6 | a. Samples were spun on a silicon oxide wafer.
b. Softbake Temperature was 70° C. for 30 minutes.
c. Exposure energy was 89.5 mJ/cm$^2$ · micron.
d. Postbake temperature was 90° C. for 30 minutes.
e. Flood energy was 89.5 mJ/cm$^2$ · micron
g. Development was batch using KTI-351 diluted 2:1 with water.
h. DANQ level of the novolac resist was 3.3 mole percent.

A comparison of Table I above and Table II below shows that film loss in the unexposed area is increased by increasing the developer strength.

TABLE II

| | | Negative Relief Images | | | |
|---|---|---|---|---|---|
| Trial | PHR DCC | Developer Dilution | Developer Time(s) | Percent Film Loss Exposed Side | Percent Film Loss Unexposed Side |
| 1 | 3 | 1:1 | 60 | 45 | 100 |
| 2 | 3 | 1:5 | 60 | 26 | 100 |
| 3 | 3 | 1.75:1 | 60 | 28 | 100 |
| 4 | 4 | 1:1 | 60 | 20 | 100 |
| 4 | 4 | 1.25:1 | 90 | 20 | 2 |
| 6 | 4 | 1:5 | 90 | 14 | 100 | a. Films were spun on a silicon oxide wafer.
b. Softbake temperature was 70° C. for 30 minutes.
c. Average film thickness was 1.55 microns
d. Exposure Energy was 88 mJ/cm$^2$ · micron
e. Postbake temperature was 100° C. for 30 minutes.
f. Flood Exposure was 90 mJ/cm$^2$ · micron
g. Development was batch using SB-351 diluted with water.
h. DANQ level of the novolac resist was 3.3 mole percent.

Increasing the postbake temperature from 90° C. to 100° C. minimizes film loss in the exposed area. Table III below shows the conditions used to obtain negative images with 3 micron lines (equal lines and spaces). Under the conditions employed good images are obtained at 3 PHR of DCC. At 4 PHR of DCC, the lines do not clear under the exposure and development conditions.

TABLE III

| | | Negative Imaging | |
|---|---|---|---|
| Trials | PHR DCC | Developer Dilution | Remarks |
| 1 | 3 | 1.75:1 | 3 microns lines clear |
| 2 | 4 | 1.50:1 | No image formed |
| 3 | 4 | 1:1 | Image formed but lines did not clear | a. Films were spun on a silicon oxide wafer.
b. Softbake temperature was 70° C. for 30 minutes.
c. Film average thickness was 1.6 microns
d. Exposure energy was 87 mJ/cm$^2$ · microns
e. Postbake temperature was 100° C. for 30 minutes
f. Flood exposure was 87 mJ/cm$^2$ · microns
g. Development was batch for 90 seconds using KTI SB-351 diluted with water.
h. DANQ level of the novolac resist was 3.3 mole percent.
i. All sample were imaged at mask (3.2 microns)

For positive relief images, 3 PHR of DCC gave the best positive relief images as shown in Table IV below.

At 4 PHR DCC, the film in the exposed area does not clear.

TABLE IV

| | | Positive Relief Images | |
|---|---|---|---|
| Trials | PHR DCC | Percent Film Loss Unexposed Side | Percent Film Loss Exposed Side |
| 1 | 3 | 9 | 98 |
| 2 | 4 | 9 | 50 |
| 3 | 5 | −3 | 38 |
| 4 | 6 | −3 | 13 |
| 5 | 7 | −3 | 4 | a. Samples were spun on a silicon oxide wafer.
b. Softbake Temperature was 70° C. for 30 minutes.
c. Exposure energy was 89.9 mJ/cm$^2$ · micron.
d. Development was batch using KTI-351 diluted 2:1 with water.
e. DANQ level of the novolac resist was 3.3 mole percent.

Positive images were obtained using various levels of DCC as shown in Table V below:

TABLE V

| | | Positive Imaging | | | | |
|---|---|---|---|---|---|---|
| Trials | PHR DCC | Exposure Energy | Developer Dilution | Flood Exposure | Postbake Temperature | Hardbake at 200° C. |
| 1 | 3 | 63 | 2:1 | 89 | 90 | Failed |
| 2 | 4 | 141 | 2:1 | 89 | 90 | Failed |
| 3 | 5 | 310 | 2:1 | 89 | 90 | Failed |
| 4 | 5 | 319 | 1.75:1 | 394 | 200 | Failed |
| 5 | 5 | 332 | 1.75:1 | — | — | — | a. Softbake temperature was 70° C.
b. Film thickness was 1.5 microns.
c. Development was batch for 90 seconds using KTI SB-351.
d. DANQ level of the novolac resist was 3.3 mole percent.
e. All samples were imaged at mask (3.2 microns).

The exposure energy to achieve an image at mask (for a 3 micron line) increases from 63.4 mJ/cm$^2$.micron at 3 PHR of DCC to 309.5 mJ/cm$^2$.micron at 5 PHR of DCC. After development, samples were flood exposed then postbaked at 90° C. for 30 minutes to test hardbake stability. Images baked at 200° C. for 30 minutes showed no hardbake stability. Images prepared from a resist containing 5 PHR of DCC were flood exposed at 394 mJ/cm$^2$.micron, then baked at 200° C. for 30 minutes. Again, the images showed no hardbake stability. This suggests that there is little molecular weight increase (or crosslinking) at these levels of DCC and DANQ. Thus, if any esterification is taking place, it is not reflected in thermal properties under the baking conditions studied.

In practice, it has been found that a developer concentration of 0.51 N and a DCC level of 3.5 PHR gives the best overall contrast in negative and positive imaging. Although an exposure energy of 90 mJ/cm$^2$ gives acceptable results, an exposure energy of 140 mJ/cm$^2$ gives the best contrast. A flood exposure of 140 mJ/cm$^2$ also gives the best contrast. The contrast gradually decreases as the flood energy increases above or decreases below 140 mJ/cm$^2$. However, 140 mJ/cm$^2$±40 gives acceptable results. In weight percent based on the resin, the carbodiimide can be present in an amount of from about 0.1 to about 50, and preferably from about 0.1 to about 20 percent.

Optimal conditions based upon design experiments are set forth in Tables VI and VII below.

TABLE VI

| Optimal Conditions For Dual-Tone Processing | | |
|---|---|---|
| | Negative Tone | Positive Tone |
| Level of Dicyclohexyl carbodiimide | 3.5% | 3.5% |

TABLE VI-continued

Optimal Conditions For Dual-Tone Processing

| | Negative Tone | Positive Tone |
|---|---|---|
| Developer Concentration | 0.51 N | 0.51 N |
| Development Time | 103 s | 98 s |
| Exposure Energy | 140 mJ | 140 mJ |
| Flood Energy | 140 mJ | — |
| Softbake Temperature | 90° C. | 110° C. |
| Softbake Time | 6 m | 6 m |
| Hardbake Temperature | 110° C. | — |
| Hardbake Time | 6 m | — |

TABLE VII

Optimal Dual-Tone Relief Images For Printed Circuit Boards

| Tone Type | % Loss Exposed Area | Predicted % Loss Exposed Area | % Loss Unexposed Area | Predicted % Loss Unexposed Area |
|---|---|---|---|---|
| Negative | 28.8 ± 1.8 | 32.5 | 97.5 ± 2.3 | 100 |
| Positive | 94.7 ± 7.0 | 100 | 3.7 ± 2.8 | 8 |

The confidence Limit is at 90% based on four experiments for the negative tone and three experiments for the positive tone. Relief image were obtained using the optimal conditions defined in Table VI.

From the data set forth above, it is concluded that a dual-tone photoresist formulation utilizing a carbodiimide of the indicated formula, provides positive and negative images with linewidths of from about 3 microns to about 5 mils. Additionally, films with thicknesses of from about 1.5 to 5.5 microns can easily be imaged. Exposure energies ranged from about 89 mJ/cm$^2$ for semiconductor applications to about 140 mJ/cm$^2$ for circuit board applications.

In the examples which follow, various procedures were employed and are described in the individual examples.

The mole fraction of phenolic ester of 1,2-naphthoquinone-(2)-diazo-5-sulfonyl chloride (DANQ-Cl) was determined in the photoresist using a Digilab FTS-40 FT-IR. The phenolic ester of DANQ-Cl was prepared as a standard. The preparation of the phenolic ester of DANQ, and the analytical procedure are described below.

PREPARATION OF THE PHENOLIC ESTER OF DANQ-Cl

To a large three neck round bottom flask equipped with a magnetic stirrer and condenser were charged 200 g of PMA (propyl methoxy acetate), 34.2 g of phenol in 50 g of PMA, 69.8 g of 1,2-naphthoquinone-(2)-diazo-5-sulfonyl chloride, and an additional 56 g of PMA.

To a feed tank were charged 32.3 g of triethyl amine and 50 g of PMA. The amine solution was fed into the reaction solution (subsurface) over a one hour period while maintaining the reaction temperature between 38° C. and 44° C. After the feed, the reaction temperature was held between 34° C. and 42° C. for 1.5 hours; then 119 g acetone, 97 g of hexane, and 160 g of water were added to the reaction solution. After about 75 g of solvent were removed under a vacuum, the product began to crystalize. The product was filtered then washed with a hexane-acetone solution (60% hexane). The product was dried overnight under vacuum. The product yield was 38%. FT-IR analysis shows a C=N$_2$ absorption (21,436 cm$^{-1}$); C=O absorption 1720 cm$^{-1}$) and aromatic vibration (1600 cm$^{-1}$). Mass spectroscopy shows a parent peak at 327 (chemical ionization using isobutane).

Beer's law Plot: To prepare solutions for a Beer's law plot, samples of the phenolic ester of DANQ-Cl (±0.0001) were weighted into 25.00 ml volumetric flasks, and the samples diluted with tetrahydrofuran. The flasks, which were 95 percent filled, were equilibrated to 25.0° C.; then, the flasks filled to the mark. Solutions were analyzed using a 0.00240 cm Br liquid -IR cell. The pathlength of the cell was determined using the fringe count method. The Beer's law plot yielded a straight line (R2=0.9999) with an intercept of −0.000506 and a slope of 2.947. The molar absorptivity at 2145 cm$^{-1}$ was calculated to be 1226.4 L/mole-cm.

The mole percent of diazonaphthoquinone attached to the novolac resin was determined by adding approximately 3 g (measured to ±0.0002) of the photoresist solution (38.9% solids) to a 25.00 ml volumetric flask. The photoresist solution was then diluted with tetrahydrofuran to just below the mark. After the flask was equilibrated to 25.00° C., the liquid level was adjusted to the mark. Solutions were analyzed using a 0.00240 cm KBr count method. The mole fraction of diazonaphthaquinone attached to the novolac resin was calculated using the diazo absorption at 2146 cm$^{-1}$.

The following examples are illustrative of the invention:

EXAMPLE 1

Preparation of a Novolac Photoresist

To a 5 liter three-neck round-bottom flask equipped with a thermometer, mechanical stirrer, and two feed lines were charged 1096 g of novolac resin (43.8% solids in PMA), 649 g of PMA, and 53.4 g of 1,2-naphthoquinone-(2)-diazo-5-sulfonyl chloride. While maintaining the contents of the reactor between 37° C. and 42° C., a 1.2 hour feed (above the surface) was started which consisted of 23.9 g of triethyl amine dissolved in 150 g of PMA. After 5 minutes of the first feed, a second feed was started which consisted of 300 g of water. The second feed as fed into the reactor over a 1.2 hour period. After the feeds were in the reaction pot, the reaction temperature was maintained between 34° C. and 38° C. for 30 minutes; then 440 g of acetone and 360 g of hexane were added. The aqueous layer was drained; then, while stirring an additional 300 g of water, 280 g of acetone, and 32 g of PMA were added. The aqueous layer was drained, and hexane, acetone and PMA were removed using a rotary evaporator until a total weight of 1324 g was achieved. The viscosity of the novolac photoresist was adjusted with PMA to 160 centistokes at 25° C. FT-IR analysis gave a DANQ mole percent of 3.3±0.04 at a 95% confidence level.

EXAMPLE 2

Preparation of a Dual-Tone Photoresist

To a 500 ml three-neck round bottom flask equipped with a thermometer, mechanical stirrer, and nitrogen purge was charged 200 grams of a novolac photoresist from Example 1 (39.6 total solids), 8136 g (10.55 PHR) of DCC, and 0.05 g of cuprous chloride. The solution was stirred overnight at 23° C. Infrared analysis showed that the reaction was complete in 89 hours.

After the reaction, the dual-tone photoresist was diluted with PMA to a viscosity of 30.5 centistokes (23.2 percent total solids) and filtered through a millipore 0.5 micron filter.

EXAMPLE 3

Demonstration of Image Reversal

A sample of the dual-tone photoresist from Example 2 was spun over a 3 inch silicon oxide wafer then softbaked at 70° C. for 30 minutes in a forced-air oven. A dry film thickness of 1.8 microns was obtained. The left side of the photoresist was then exposed using a broadband UV source from a Cobilt aligner for 65 seconds. The wafer was postbaked at 90° C. for 30 minutes in a force-air oven; then, the whole wafer flood exposed for 65 seconds. A negative relief image (photoresist on the left side of the wafer) was obtained by developing the photoresist with a sodium hydroxide based developer (KTI SB-351 diluted with 1 part water) which contained 4% tetrahydrofuran for 90 seconds. The left side of the wafer lost 26% of the resist. The right side (unexposed side) lost 100% of the resist.

EXAMPLE 4

Preparation of A Dual-Tone Photoresist

To a 4 ounce bottle equipped with a magnetic stirrer was charged 50 grams of a novolac photoresist (39.67% total solids in PMA), 0.598 grams of DCC, and 0.01 grams of cuprous chloride. The sample was stirred until reaction was complete.

EXAMPLE 5

Preparation of A Dual-Tone Photoresist

To a 4 ounce bottle equipped with a magnetic stirrer was charged 50 grams of a novolac photoresist (39.67% total solids in PMA), 1.388 grams of DCC, and 0.01 grams of cuprous chloride. The sample was stirred until reaction was complete.

EXAMPLE 6

Demonstration of Image Reversal

A sample of the photoresist from Example 4 was spun over a silicon oxide wafer then softbaked at 70° C. for 30 minutes in a forced-air oven. A dry film thickness of 1.62 microns was obtained. The film was then baked in a forced-air oven at 100° C. for 30 minutes, and exposed through a light field postive mask using a cobilt aligner at 87 mJ/cm$^2$.micron. A negative image was then obtained by developing with a sodium hydroxide based developer (KTI SB-351 diluted with 1.75 parts of water) for 90 seconds. The negative image was the reverse image of a 3 micron line.

EXAMPLE 7

Demonstration of a Positive Tone Image

A sample of the photoresist from Example 4 was spun over a silicon oxide wafer then softbaked at 70° C. for 30 minutes in a forced-air oven. A dry film thickness of 1.49 microns was obtained. The film was then exposed through a light field positive mask using a cobilt alinger at 87 mJ/cm$^2$.micron. A positive image was then obtained by developing with a sodium hydroxide based developer (KTI SB-351 diluted with 2 parts water) for 90 seconds. The positive image had a line width of 3 microns.

EXAMPLE 8

Demonstration of a Positive Tone Image

A sample of the photoresist from Example 5 was spun over a silicon oxide wafer then softbaked at 70° C. for 30 minutes in a forced-air oven. A dry film thickness of 1.52 microns was obtained. The film was then exposed with a light field positive mask at 309.5 mJ/cm$^2$.microns. A positive image was then obtained by developing with a sodium hydroxide based developer (KTI SB-351 diluted with 2 parts water) for 90 seconds. The positive image had a line width of 3.25 microns.

EXAMPLE 9

Demonstration of Image Reversal

A sample of the photoresist prepared in a manner similar to that of Example 4 was spun over a silicon oxide wafer then softbaked at 70° C. for 30 minutes in a forced-air oven. A dry film thickness of 1.66 microns was obtained. The film was then exposed with a cobilt aligner through light field positive mask at 90 mJ/cm$^2$.micron. The film then postbaked in a forced-air oven at 100° C. for 30 minutes, and flood exposed at 80 mJ/cm$^2$.micron. A negative image was then obtained using KIT 934 developer (a metal ion free developer based on tetramethyl ammonium hydroxide).

EXAMPLE 10

Preparation of a Dual-Tone Photoresist For Circuit Boards

To a 8 ounce amber bottle was charged 200 grams of a photoresist prepared in a manner similar to that of Example 1 (44.36% total solids in PMA), 3.105 grams of DCC (3.5 PHR), and 0.48 grams of cuprous chloride. The bottle was rolled on a roller for 41 hours. The total solids and viscosity of the macroresist were adjusted with PMA to 17.9% total solids and 6.4 centistokes, respectively.

EXAMPLE 11

Demonstration of Image Reversal

Using the sample from Example 10, a film was deposited on a copper board by dip coating at a withdrawal rate of 8.8 inches per minute. The film was softbaked at 90° C. for 6 minutes. The film thickness was 3.7 microns. The film was exposed through a positive light field mask using a colight unit for printed circuit boards at 140 mJ/cm$^2$. The photoresist was then baked at 110° C. for 6 minutes and flood exposed at 140 mJ/cm$^2$. A negative image was obtained by developing with a sodium hydroxide based developer (KTI SB-351 diluted with water to a normality of 0.51 N) for 103 seconds. The line width was 5 mils. The exposed copper was then etched at 50° C. using a ferric chloride solution. A negative copper pattern was obtained.

EXAMPLE 12

Demonstration of Image Reversal

Using the sample from Example 10, a film was deposited on a copper board by dip coating at a withdrawal rate of 8.8 inches per minute. The film was softbaked at 90° C. for 6 minutes. The film thickness was 4.2 microns. The photoresist was exposed through a postive light field mask using a colight unit for printed circuit boards at 140 mJ/cm$^2$. The photoresist was then baked at 110° C. for 6 minutes and flood exposed at 140 mJ/cm$^2$. A negative image was obtained by developing with a sodium hydroxide based developer (KTI SB-351 diluted with water to a normality of 0.47 N) for 137 seconds. Micrographs showed the linewidth to be 4 mils.

EXAMPLE 13

Demonstration of Image Reversal

Using the sample from Example 10, a film was deposited on a copper board by dip coating at a withdrawal reate of 8.8 inches per minute. The film was softbaked at 90° C. for 6 minutes. An initial film thickness of 4.2 microns was obtained. The photoresist was exposed through a positive light field mask using a colight unit for printed circuit boards at 90 mJ/cm$^2$. The photoresist was then baked at 110° C. for 6 minutes and flood exposed at 140 mJ/cm$^2$. A negative image was obtained by developing with a sodium hydroxide based developer (KTI SB-351 diluted with water to a normality of 0.51 N) for 108 seconds. Micrographs showed the linewidth to be 5.5 mils.

EXAMPLE 14

Demonstration of a Positive Tone Image

Using the sample from Example 10, a film was deposited on a copper board by dip coating at a withdrawal rate of 8.8 inches per minute. The film was softbaked a 110° C. for 6 minutes. The film thickness was 3.7 microns. The photoresist was exposed through a positive light field mask using a colight unit for printed circuit boards at 140 mJ/cm$^2$. A positive image was obtained by developing with a sodium hydroxide based developer (KTI SB-351 diluted with water to a normality of 0.51 N) for 98 seconds. The line width was 5 mils. An exposed copper pattern was obtained.

EXAMPLE 15

Demonstration of a Positive Tone Image

Using the sample from Example 10, a film was deposited on a copper board by dip coating at a withdrawal rate of 8.8 inches per minute. The film was softbaked a 110° C. for 6 minutes. The film thickness was 4.2 microns. The photoresist was exposed through a positive light field mask using a colight unit for printed circuit boards at 140 mJ/cm$^2$. A positive image was obtained by developing with a sodium hydroxide based developer (KTI SB-351 diluted with water to a normality of 0.47 N) for 123 seconds. Micrographs showed the line width to be 5.6 mils.

EXAMPLE 16

Demonstration of a Positive Tone Image

Using the sample from Example 10, a film was deposited on a copper board by dip coating at a withdrawal rate of 8.8 inches per minute. The film was softbaked a 110° C. for 6 minutes. The film thickness was 4.2 microns. The photoresist was exposed through a positive light field mask using a colight unit for printed circuit boards at 90 mJ/cm$^2$. A positive image was obtained by developing with a sodium hydroxide based developer (KTI SB-351 diluted with water to a normality of 0.51 N) for 110 seconds. Micrographs showed the line width to be 5.2 mils.

Although the invention has been illustrated by the preceding examples it is not to be construed as being limited to the materials disclosed herein, but rather, the invention relates to the generic area as hereinbefore disclosed. Various modifications and embodiments thereof can be made without departing from the spirit or scope thereof.

What is claimed is:

1. A liquid, dual-tone photoresist formulation of improved stability for the production of positive or negative images comprising a photoresist of a phenol-formaldehyde resin and a diazonaphthoquinone sensitizer wherein the diazonaphthoquinone sensitizer is attached to the backbone of said phenol-formaldehyde resin; and a stabilizing amount of a carbodiimide of the formula:

$$R-N=C=N-R$$

wherein each R, independently, can be a secondary or tertiary alkyl group of from 3 to 30 carbon atoms, a cycloalkyl group of up to 30 carbon atoms, or one R can be an aryl group of up to 30 carbon atoms.

2. A photoresist formulation as defined in claim 1 wherein the said diazonaphthoquinone is 1,2-naphthoquinone-(2)-diazo-5-sulfonyl chloride.

3. A photoresist formulation as defined in claim 1 wherein the said carbodiimide is dicyclohexyl carbodiimide.

4. The formulation of claim 1 wherein the carbodiimide is present in an amount of from about 0.1 to about 50 weight percent based on the weight of resin.

5. The formulation of claim 1 wherein each R of the carbodiimide is a secondary alkyl group.

6. The formulation of claim 1 wherein each R of the carbodiimide is an isopropyl group.

7. The formulation of claim 1 wherein each R of the carbodiimide is a tertiary alkyl group.

8. The formulation of claim 1 wherein each R of the carbodiimide is a tertiary butyl group.

9. The formulation of claim 1 wherein each R of the carbodiimide is a cylcoalkyl group.

10. The formulation of claim 1 wherein each R of the carbodiimide is a cyclohexyl group.

11. A process for providing a liquid, dual-tone photoresist formulation of improved stability which comprises adding to a photoresist of a phenol-formaldehyde resin and a diazonaphthoquinone sensitizer wherein the diazonaphthoquinone sensitizer is attached to the backbone of said phenol-formaldehyde resin, at least a stabilizing amount of a carbodiimide of the formula:

$$R-N=C=N-R$$

wherein each R, independently, can be a secondary or tertiary alkyl group of from 3 to 30 carbon atoms, a cycloalkyl group of up to 30 carbon atoms, or one R can be an aryl group of up to 30 carbon atoms.

12. The process of claim 11 wherein said diazonaphthoquinone is 1,2-naphthoquinone-(2)-diazo-5-sulfonyl chloride.

13. The process of claim 11 wherein the said carbodiimide is dicyclohexyl carbodiimide.

14. The process of claim 11 wherein the carbodiimide is present in an amount of from about 0.1 to about 50 weight percent based on the weight of resin.

15. The process of claim 11 wherein each R of the carbodiimide is a secondary alkyl group.

16. The process of claim 11 wherein each R of the carbodiimide is an isopropyl group.

17. The process of claim 11 wherein each R of the carbodiimide is a tertiary alkyl group.

18. The process of claim 11 wherein each R of the carbodiimide is a tertiary butyl group.

19. The process of claim 11 wherein each R of the carbodiimide is a cylcoalkyl group.

20. The process of claim 11 wherein each R of the carbodiimide is a cyclohexyl group.

* * * * *